(12) United States Patent
Song et al.

(10) Patent No.: US 10,209,327 B2
(45) Date of Patent: Feb. 19, 2019

(54) MAGNETIC RESONANCE IMAGING APPARATUS, RADIO FREQUENCY AMPLIFICATION SYSTEM AND METHOD

(71) Applicant: General Electric Company, Schenectady, NY (US)

(72) Inventors: Tingting Song, ShangHai (CN); Xin Jiang, ShangHai (CN); Jifeng Chen, ShangHai (CN)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 200 days.

(21) Appl. No.: 15/329,186

(22) PCT Filed: Jul. 24, 2015

(86) PCT No.: PCT/CN2015/085022
§ 371 (c)(1),
(2) Date: Jan. 25, 2017

(87) PCT Pub. No.: WO2016/011973
PCT Pub. Date: Jan. 28, 2016

(65) Prior Publication Data
US 2017/0212193 A1    Jul. 27, 2017

(30) Foreign Application Priority Data
Jul. 25, 2014    (CN) .......................... 2014 1 0359319

(51) Int. Cl.
*G01R 33/36* (2006.01)
*H03F 3/189* (2006.01)
*H03F 1/32* (2006.01)

(52) U.S. Cl.
CPC ......... *G01R 33/3614* (2013.01); *G01R 33/36* (2013.01); *H03F 1/3247* (2013.01);
(Continued)

(58) Field of Classification Search
CPC ...... H03F 1/3247; H03F 1/3294; H03F 3/189; H03F 3/24; H03F 3/245;
(Continued)

(56) References Cited

U.S. PATENT DOCUMENTS 5,867,065 A * 2/1999 Leyendecker ........ H03F 1/3247
330/149
5,920,808 A * 7/1999 Jones .................... H03F 1/3247
455/126
(Continued)

FOREIGN PATENT DOCUMENTS

CN    1384602 A    12/2002
CN    1394549 A    2/2003
(Continued)

OTHER PUBLICATIONS

International Search Report and Written Opinion for International Application No. CN2015/085022, dated Jul. 24, 2015, 12 pages.
(Continued)

*Primary Examiner* — Ruifeng Pu

(57) ABSTRACT

A radio frequency (RF) amplification method, comprising: modulating a first digital carrier signal with a digital envelop signal to generate digital RF pulse signals having a first frequency, converting the digital RF pulse signals into analog RF pulse signals, amplifying the analog RF pulse signals to generate an RF output signal, converting an analog feedback signal sampled from the RF output signal into digital feedback signals; demodulating the digital feedback signals with a second digital carrier signal to generate an in-phase (I) signal and a quadrature (Q) signal, and generating an amplitude setting signal for adjusting an amplitude of the digital envelop signal and a phase setting signal for adjusting a phase of the first digital carrier signal according to the I signal and the Q signal. The second digital carrier signal has a predetermined frequency shift relative to the
(Continued)

first digital carrier signal, and the second digital carrier signal has a predetermined phase shift relative to the first digital carrier signal. The present invention also provides an RF amplification system and a magnetic resonance imaging (MRI) apparatus.

15 Claims, 5 Drawing Sheets

(52) U.S. Cl.
CPC ....... *H03F 3/189* (2013.01); *H03F 2200/165* (2013.01); *H03F 2200/336* (2013.01); *H03F 2200/451* (2013.01); *H03F 2200/471* (2013.01)

(58) Field of Classification Search
CPC .................................. H03F 1/32–1/3241; H03F 2200/165–2200/471; G01R 23/02; G01R 19/0007; G01R 33/36; G06K 9/00369; G06K 7/10346; G06T 2207/10016; G06T 7/20

See application file for complete search history.

(56) References Cited

U.S. PATENT DOCUMENTS

| | | | |
|---|---|---|---|
| 6,295,442 B1 | 9/2001 | Camp, Jr. et al. | |
| 7,409,004 B2 | 8/2008 | Booth et al. | |
| 8,718,577 B1* | 5/2014 | Smidth | H04B 15/04 375/296 |
| 2002/0085647 A1* | 7/2002 | Oishi | H03F 1/3247 375/297 |
| 2004/0146118 A1* | 7/2004 | Talwalkar | H03C 1/52 375/298 |
| 2004/0166813 A1* | 8/2004 | Mann | H03F 1/3247 455/69 |
| 2005/0157814 A1* | 7/2005 | Cova | H03F 1/3247 375/297 |
| 2005/0180527 A1* | 8/2005 | Suzuki | H03F 1/3247 375/297 |
| 2005/0195919 A1* | 9/2005 | Cova | H03F 1/3258 375/297 |
| 2006/0183454 A1 | 8/2006 | Al-Mahdawi | |
| 2008/0280573 A1* | 11/2008 | Lane | H03C 5/00 455/126 |
| 2010/0323638 A1* | 12/2010 | Lozhkin | H03F 1/3247 455/113 |
| 2010/0323639 A1* | 12/2010 | Lozhkin | H04B 1/0475 455/113 |
| 2010/0323640 A1* | 12/2010 | Lozhkin | H03F 1/3247 455/113 |
| 2010/0327887 A1* | 12/2010 | Denison | A61B 5/0002 324/692 |
| 2013/0051492 A1* | 2/2013 | Hansen | H03F 1/3247 375/297 |
| 2014/0057684 A1* | 2/2014 | Khlat | H04W 52/0209 455/574 |
| 2017/0012675 A1* | 1/2017 | Frederick | G06K 7/10009 |
| 2017/0153279 A1* | 6/2017 | Chung | G01R 19/0007 |

FOREIGN PATENT DOCUMENTS

| | | |
|---|---|---|
| CN | 101288588 A | 10/2008 |
| CN | 101473529 A | 7/2009 |

OTHER PUBLICATIONS

Chinese OA for patent application No. 201410359319.3, dated Oct. 9, 2017, 5 pages.

\* cited by examiner

MAGNETIC RESONANCE IMAGING APPARATUS, RADIO FREQUENCY AMPLIFICATION SYSTEM AND METHOD

CROSS-REFERENCE TO RELATED APPLICATIONS

This is a national stage application under 35 U.S.C. § 371 (c) of PCT Patent Application No. CN2015/085022, filed on Jul. 24, 2015, which claims priority to Chinese Patent Application No. 201410359319.3, filed on Jul. 25, 2014, the disclosures of which are incorporated herein by reference in their entireties.

BACKGROUND

The present invention relates to the technical field of radio frequency (RF), particularly to a magnetic resonance imaging apparatus, an RF amplification system and method.

Many forms of wireless communication use RF transmission. An RF carrier signal may be modulated to carry information. The modulated RF carrier signal may be amplified and transmitted. In order to prevent the modulated RF carrier signal from carrying distorted information, the amplification process generally needs to be kept relatively linear.

For example, a magnetic resonance imaging (MRI) apparatus generally has an RF amplification system, which drives an RF coil located within its main magnetic structure with an RF amplifier. The RF amplifier receives a series of pulses generated by an external RF source as its input signal and generates a series of pulses with enhanced power as its output signal that is transmitted and used for driving the RF coil. However, during the RF amplification, non-linearity of gain and phase of the RF amplifier may be introduced into the system, which results in distortion of an MRI image. In order to avoid such a case, the RF amplification system generates a feedback signal with a feedback device to correct non-linearity factors introduced during the RF amplification to keep linearity.

However, in the traditional RF amplification system, there are technical problems such as too many electronic elements, complicated circuit design, etc. Therefore, there is a need to propose a novel RF amplification system and method.

SUMMARY

One or more aspects of the present invention are now summarized for basically understanding the present invention, in which the summary is not an extensible overview of the present invention, and is not intended to identify some elements of the present invention, nor intended to define its scope. On the contrary, the main purpose of this summary is to present some concepts of the present invention in a simplified form before more detailed description is presented hereinafter.

One aspect of the present invention is to provide an RF amplification system. The RF amplification system comprises a first digital modulator, a digital to analog converter (DAC), an RF amplifier, an analog to digital converter (ADC), a digital demodulator and a feedback control device. The first digital modulator is used for modulating a first digital carrier signal with a digital envelop signal to generate digital RF pulse signals having a first frequency. The DAC is used for converting the digital RF pulse signals into analog RF pulse signals. The RF amplifier is used for amplifying the analog RF pulse signals to generate an RF output signal. The ADC is used for converting an analog feedback signal sampled from the RF output signal into digital feedback signals. The digital demodulator is used for demodulating the digital feedback signals with a second digital carrier signal to generate an in-phase (I) signal and a quadrature (Q) signal. The feedback control device is used for generating an amplitude setting signal for adjusting an amplitude of the digital envelop signal and a phase setting signal for adjusting a phase of the first digital carrier signal according to the I signal and the Q signal. The second digital carrier signal has a predetermined frequency shift relative to the first digital carrier signal, and the second digital carrier signal has a predetermined phase shift relative to the first digital carrier signal.

Another aspect of the present invention is to provide an RF amplification method. The RF amplification method comprises: modulating a first digital carrier signal with a digital envelop signal to generate digital RF pulse signals having a first frequency, converting the digital RF pulse signals into analog RF pulse signals, amplifying the analog RF pulse signals to generate an RF output signal, converting an analog feedback signal sampled from the RF output signal into digital feedback signals; demodulating the digital feedback signals with a second digital carrier signal to generate an in-phase (I) signal and a quadrature (Q) signal, generating an amplitude setting signal for adjusting an amplitude of the digital envelop signal and a phase setting signal for adjusting a phase of the first digital carrier signal according to the I signal and the Q signal. The second digital carrier signal has a predetermined frequency shift relative to the first digital carrier signal, and the second digital carrier signal has a predetermined phase shift relative to the first digital carrier signal.

Another aspect of the present invention is to provide an MRI apparatus. The MRI apparatus comprises an RF coil assembly and an RF amplification system. The RF amplification system comprises a first digital modulator, a DAC, an RF amplifier, an ADC, a digital demodulator and a feedback control device. The first digital modulator is used for modulating a first digital carrier signal with a digital envelop signal to generate digital RF pulse signals having a first frequency. The DAC is used for converting the digital RF pulse signals into analog RF pulse signals. The RF amplifier is used for amplifying the analog RF pulse signals to generate an RF output signal for exciting the RF coil assembly to transmit RF signals. The ADC is used for converting an analog feedback signal sampled from the RF output signal into digital feedback signals. The digital demodulator is used for demodulating the digital feedback signals with a second digital carrier signal to generate an in-phase (I) signal and a quadrature (Q) signal. The feedback control device is used for generating an amplitude setting signal for adjusting an amplitude of the digital envelop signal and a phase setting signal for adjusting a phase of the first digital carrier signal according to the I signal and the Q signal. The second digital carrier signal has a predetermined frequency shift relative to the first digital carrier signal, and the second digital carrier signal has a predetermined phase shift relative to the first digital carrier signal.

The MRI apparatus, the RF amplification system and method provided by the present invention have advantageous technical effects such as a simple structure, less electronic elements, simple circuit design and the like.

BRIEF DESCRIPTION OF THE DRAWINGS

The present disclosure can be better understood in light of description of embodiments of the present disclosure with reference to the accompanying drawings.

DETAILED DESCRIPTION

Hereafter, a detailed description will be given for embodiments of the present disclosure. It should be pointed out that in the detailed description of the embodiments, for simplicity and conciseness, it is impossible for the Description to describe all the features of the practical embodiments in details. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for those of ordinary skilled in the art associated with the contents disclosed in the present disclosure, which should not be regarded as insufficient disclosure of the present disclosure.

Unless defined otherwise, all the technical or scientific terms used in the Claims and the Description should have the same meanings as commonly understood by one of ordinary skilled in the art to which the present disclosure belongs. The terms "first", "second" and the like in the Description and the Claims of the present utility model do not mean any sequential order, number or importance, but are only used for distinguishing different components. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", without excluding other elements or objects. The terms "coupled", "connected" and the like are not limited to being connected physically or mechanically, but may comprise electric connection, no matter directly or indirectly.

Figure 1:
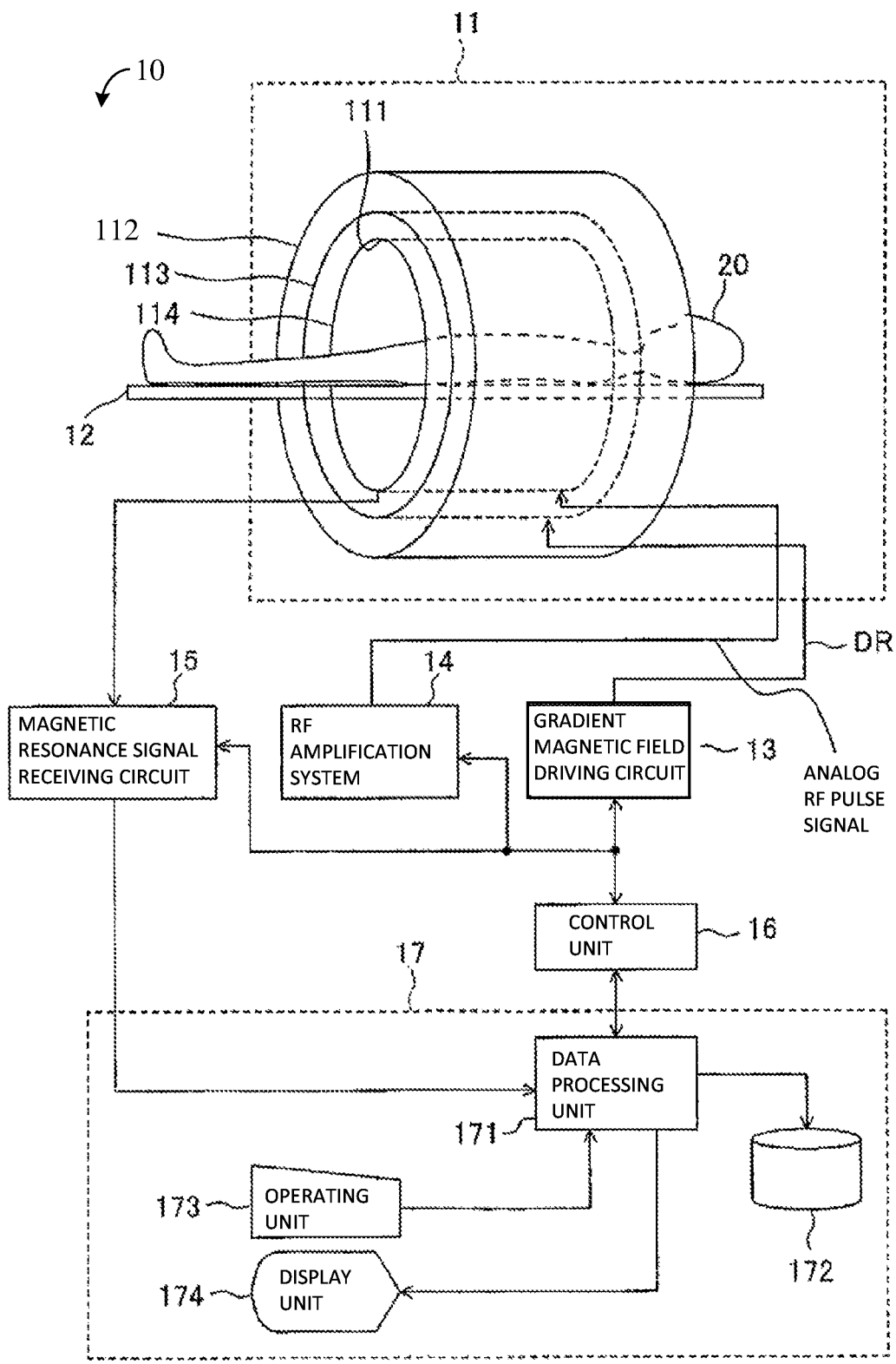
FIG. 1 is a schematic diagram of an MRI apparatus according to one embodiment.

Please refer to FIG. 1, FIG. 1 is a schematic diagram of a magnetic resonance imaging (MRI) apparatus 10. The MRI apparatus 10 includes a magnetic system 11, a cradle 12, a gradient magnetic field driving circuit 13, an RF amplification system 14, a magnetic resonance signal receiving circuit 15, a control unit 16, and an operator console 17.

The magnetic system 11 includes an internal space (bore) 111 that is actually in shape of horizontal cylinder as shown in FIG. 1, and the cradle 12 on which an object 20 (e.g., a patient) is positioned. The cradle 12 is supported on a cushion and moved into the bore 111 by a conveying mechanism (not shown).

In the magnetic system 11, a static magnetic field generator 112, a gradient coil assembly 113 and an RF coil assembly 114 are positioned near a magnetic center (a position of a scan center) of the bore 111.

The static magnetic field generator 112 forms a static magnetic field in the bore 111. A direction of the static magnetic field is, for example, parallel with an axial direction of the object 20. However, the direction of the static magnetic field may also be perpendicular to the axial direction of the object 20.

The gradient coil assembly 113 generates a gradient magnetic field to slope an intensity of the static magnetic field formed by the static magnetic field generator 112. As such, a magnetic resonance signal received by the RF coil assembly 114 may just provide a three-dimensional (3D) position information. The gradient magnetic field generated by the gradient coil assembly 113 has three types: a gradient magnetic field for selecting a slice; a gradient magnetic field for encoding a frequency; and a gradient magnetic field for encoding a phase. In order to provide such three types of gradient magnetic fields, the gradient coil assembly 113 includes three gradient magnetic field coil systems.

The RF coil assembly 114 transmits RF pulses to excite spin of protons inside the object 20 in a space of the static magnetic field formed by the static magnetic field generator 112, thus generating the magnetic resonance signal. At the same time, the RF coil assembly 114 receives the magnetic resonance signal generated by the object 20. The RF coil assembly 114 may be configured to have a transmitting RF coil unit and a receiving RF coil unit respectively, or be configured to perform transmitting the RF pulses and receiving the magnetic resonance signal by the same RF coil unit.

Based on a command issued by the control unit 16, the gradient magnetic field driving circuit 13 provides a driving signal DR to the gradient coil assembly 113 to generate a gradient magnetic field. The gradient magnetic field driving circuit 13 includes three driving circuit systems (not shown) that correspond to the three gradient magnetic field coil systems of the gradient coil assembly 113.

The RF amplification system 14 includes an RF pulse frequency synthesizer that will be described thereafter and uses the RF pulse frequency synthesizer to generate analog RF pulse signals. The analog RF pulse signals are applied to the RF coil assembly 114 that transmits RF signals.

The magnetic resonance signal receiving circuit 15 acquires the analog magnetic resonance signal received by the RF coil assembly 114, converts the analog magnetic resonance signal into a baseband digital magnetic resonance signal, and outputs the baseband digital magnetic resonance signal to a data processing unit 171 in the operator console 17.

The control unit 16 controls the gradient magnetic field driving circuit 13 and the RF amplification system 14 according to a predetermined pulse sequence to generate the driving signal DR and the analog RF pulse signals. In addition, the control unit 16 controls the magnetic resonance signal receiving circuit 15.

The operator console 17 includes the data processing unit 171, an image database 172, an operation unit 173, and a display unit 174. As shown in FIG. 1, the data processing unit 171 overall controls the magnetic resonance imaging apparatus 10, image reproduction processing, etc. The control unit 16 is connected to the data processing unit 171 that controls operation of the control unit 16. In addition, the image database 172, the operation unit 173 and the display unit 174 are connected to the data processing unit 171. The image database 172 includes, e.g., a recordable/reproducible hardware device or similar device to record reproduced image data and the like. The operation unit 173 includes a keyboard, a mouse and the like, and the display unit 174 includes a graph display or similar device.

The RF coil assembly 114 is an embodiment of the RF coil assembly included in the present invention, and the RF amplification system 14 is an embodiment of the RF amplification system included in the present invention.

An embodiment of the present invention provides an RF amplification system, which includes an RF amplifier and a feedback control device. The feedback control device may achieve high linearity and high stability under different loads and obtain a constant gain (which refers to a magnitude proportion between an output signal and an input signal). The feedback control device includes an amplitude control loop and a phase control loop that are independent from each other, for independently controlling an amplitude and a phase, such that a response of the amplitude and a response of the phase may be optimized independently to obtain a high bandwidth so as to, for example, satisfy a high bandwidth that an MRI system requires. As such, the RF amplifier may be compensated at a very fast response speed under different loads so as to be stabilized. Different feedback signals (e.g., an output power or current of the RF amplifier) are used to perform feedback control, such that a stable power gain or a stable current source may be obtained. More specifically, in the system or method described herein, the output power or the output current of the RF amplifier may be used as a feedback signal to perform the feedback control. When the output power is used as the feedback signal for control, a stable power gain may be obtained; and when the output current is used as the feedback signal for control, a stable current source may be obtained.

Figure 2:
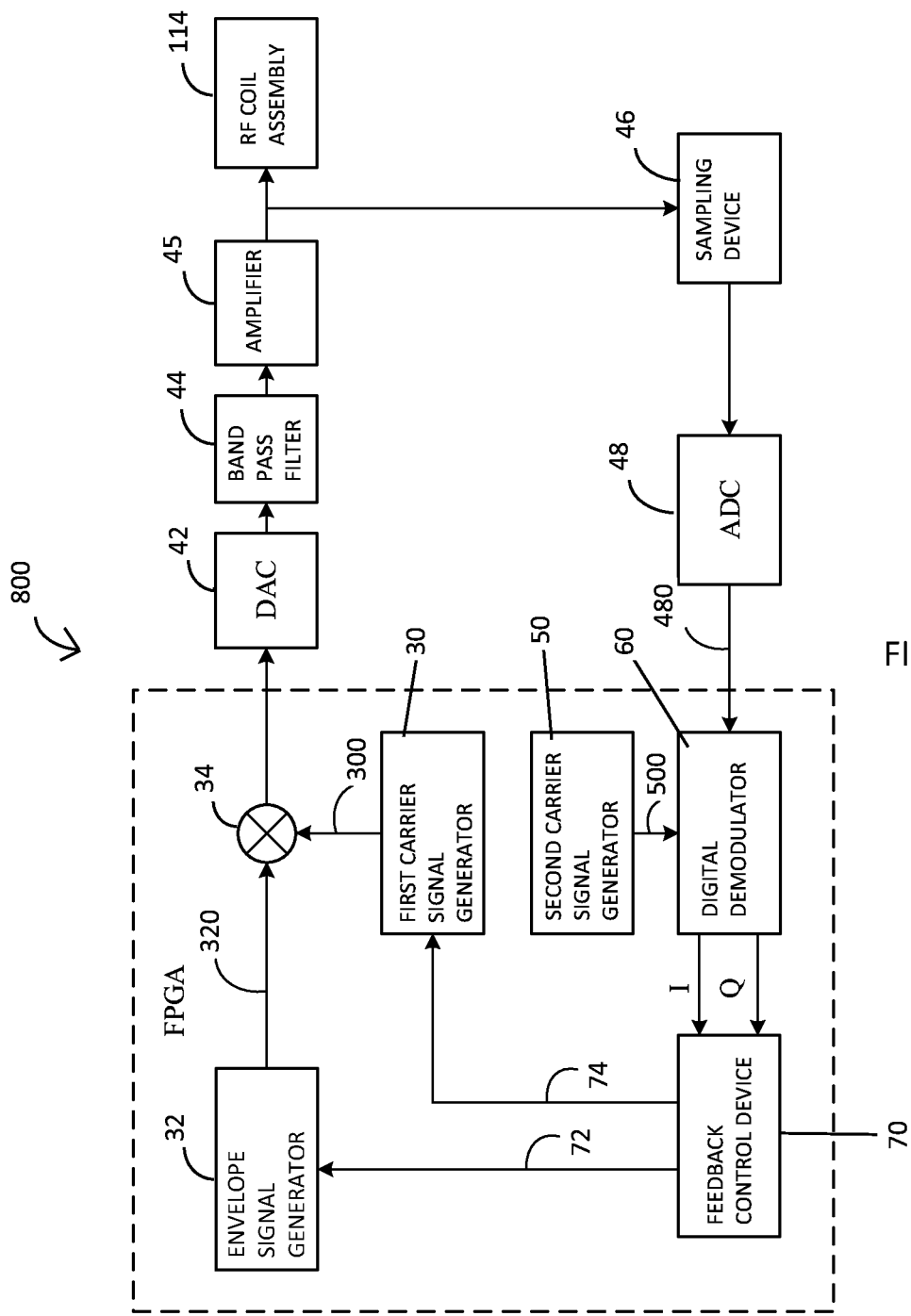
FIG. 2 is a functional module diagram of an RF amplification system according to a first embodiment.

Please refer to FIG. 2, FIG. 2 is a functional module diagram of an RF amplification system 800 according to a first embodiment. The RF amplification system 800 includes a first carrier signal generator 30, an envelope signal generator 32, a first digital modulator 34, a DAC 42, a filter 44, an RF amplifier 45, a sampling device 46, an ADC 48, a digital demodulator 60, and a feedback control device 70.

In a non-limitative example, the first carrier signal generator 30, the second carrier signal generator 50, and the sampling device 46 may not be included in the RF amplification system 800. In a non-limitative example, the RF amplification system 800 may not include the filter 44.

The first carrier signal generator 30 is used for generating a first digital carrier signal 300.

The envelope signal generator 32 is used for generating a digital envelop signal 320.

The first digital modulator 34 modulates the first digital carrier signal 300 with the digital envelop signal 320 to generate digital RF pulse signals having a first frequency. In a non-limitative example, the first digital modulator 34 is a digital mixer.

The DAC 42 is used for converting the digital RF pulse signals having the first frequency into analog RF pulse signals.

The filter 44 is used for filtering out high-order harmonic components in the analog RF pulse signals. In a non-limitative example, the filter 44 is a band-pass filter.

The RF amplifier 45 is used for amplifying the filtered analog RF pulse signals to generate an RF output signal. In a non-limitative example, the RF output signal is used for exciting the RF coil assembly 114 in the magnetic resonance imaging apparatus to transmit RF signals. It may be understood that the RF output signal may be provided to other loads, for example, general coils that is not applied in the magnetic resonance imaging apparatus.

The first frequency of the digital RF pulse signals is determined depending on the intensity of the static magnetic field. For example, in the apparatus with a static magnetic field intensity of 1.5 T (Tesla), the first frequency of the digital RF pulse signals is about 64 MHz. A sampling frequency fs of the DAC 42 must be greater than or equal to a Nyquist frequency. In FIG. 2, the sampling frequency is, for example, 200 MHz.

For another example, in the apparatus with a static magnetic field intensity of 3.0 T (Tesla), the first frequency of the digital RF pulse signals is about 128.1 MHz. The sampling frequency fs of the DAC 42 must be greater than or equal to the Nyquist frequency. In FIG. 2, the sampling frequency fs is, for example, 480 MHz or 640 MHz.

The sampling device 46 is used for sampling the RF output signal to generate an analog feedback signal. The sampling device 46 may be a coupler for obtaining a power feedback signal (e.g., a directional coupler) or a sensor for obtaining a current feedback signal (e.g., a current sensor).

The ADC 48 is used for converting the analog feedback signal into digital feedback signals 480.

The second carrier signal generator 50 is used for generating a second digital carrier signal 500.

The digital demodulator 60 is used for performing quadrature demodulation on the digital feedback signals with the second digital carrier signal to generate an in-phase (I) signal and a quadrature (Q) signal. A specific demodulation manner will be described in the subsequent FIG. 3.

The feedback control device 70 is used for generating an amplitude setting signal 72 and a phase setting signal 74 according to the I signal and the Q signal. The amplitude setting signal 72 is provided to the envelope signal generator 32 for adjusting an amplitude of the digital envelop signal 320. The phase setting signal 74 is provided to the first carrier signal generator 30 for adjusting a phase of the first digital carrier signal 300.

In a non-limitative example, the first carrier signal generator 30, the envelop signal generator 32, the second carrier signal generator 50, the digital demodulator 60 and the feedback control device 70 may be integrated in an FPGA. In other words, the first carrier signal generator 30, the envelop signal generator 32, the second carrier signal generator 50, the digital demodulator 60 and the feedback control device 70 are internal logic functional modules of the FPGA.

The second digital carrier signal 500 has a predetermined frequency shift relative to the first digital carrier signal 300, and the second digital carrier signal 500 has a predetermined phase shift relative to the first digital carrier signal 300.

It can be seen from the above that as a first non-limitative example, a frequency of the second digital carrier signal 500 is f3 and a frequency of the first digital carrier signal 300 is f1, wherein f3=f1, i.e., a frequency shift between the second digital carrier signal 500 and the first digital carrier signal 300 is 0.

As a second non-limitative example, the frequency of the second digital carrier signal 500 is f3 and the frequency of the first digital carrier signal 300 is f1, wherein f3=fs−f1. In other words, the frequency difference between the second digital carrier signal 500 and the first digital carrier signal 300 is fs−2f1, wherein fs is a sampling frequency of the ADC 48.

In a non-limitative example, a phase difference between the second digital carrier signal 500 and the first digital carrier signal 300 is 0.

Figure 3:
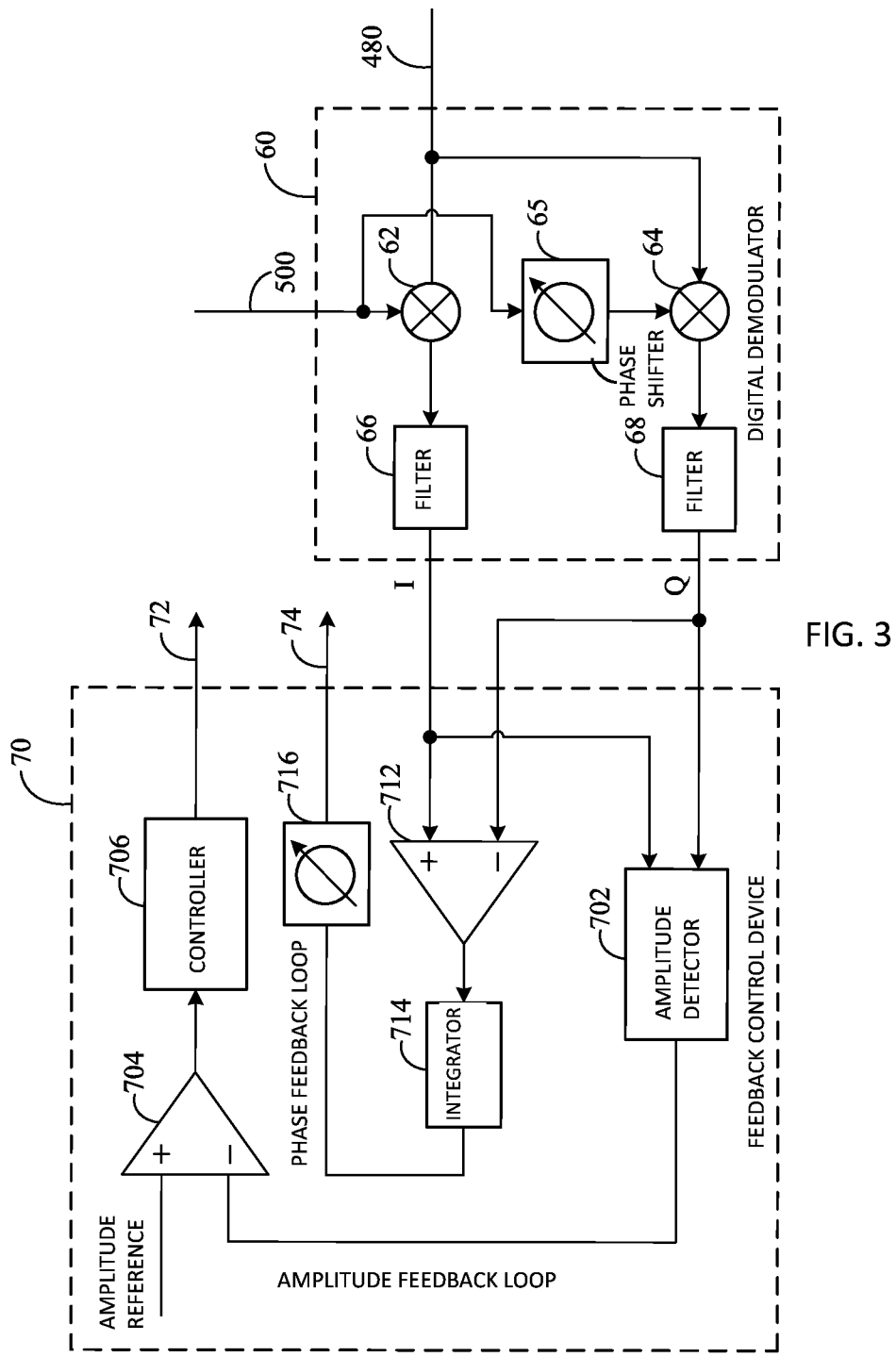
FIG. 3 is a functional module diagram of one embodiment of a digital demodulator and a feedback control device as shown in FIG. 2.

Also refer to FIG. 3, which is a functional module diagram of one embodiment of the digital demodulator 60 and the feedback control device 70 as shown in FIG. 2. The digital demodulator 60 utilizes the second digital carrier signal 500, the digital modulators 62, 64, and a 90-degree phase shifter 65, or may further include two filters 66, 68 (e.g., low-pass filters) for converting a vector of the digital feedback signal 480 into a quadrature scalar to generate an I signal and a Q signal of a carrier at zero frequency. The I signal and the Q signal are in-phase and quadrature components of the digital feedback signal 480 respectively.

The feedback control device 70 includes an amplitude feedback loop and a phase feedback loop.

The amplitude feedback loop is used for achieving amplitude adjustment. The amplitude feedback loop includes an amplitude function 702, a comparator 704, and a controller 706. The amplitude function 702 is used for obtaining a feedback amplitude $\sqrt{I^2+Q^2}$ from the I signal and the Q signal. The comparator 704 is used for comparing the feedback amplitude with a reference amplitude to generate an amplitude error signal. The controller 706 is used for generating the above amplitude setting signal 72 according to the amplitude error signal.

The phase feedback loop is used for achieving phase adjustment. In a non-limitative example, the phase feedback loop includes a comparator 712, an integrator 714, and a phase shifter 716. The comparator 712 is used for comparing the I signal with the Q signal to generate a phase error signal. If I is equal to Q, it is judged that no phase error exists; if I is not equal to Q, it is judged that a phase error exists. The integrator 714 and the phase shifter 716 are respectively used for accumulating the phase error and generating the above phase setting signal 74 responding to the phase error.

Figure 4:
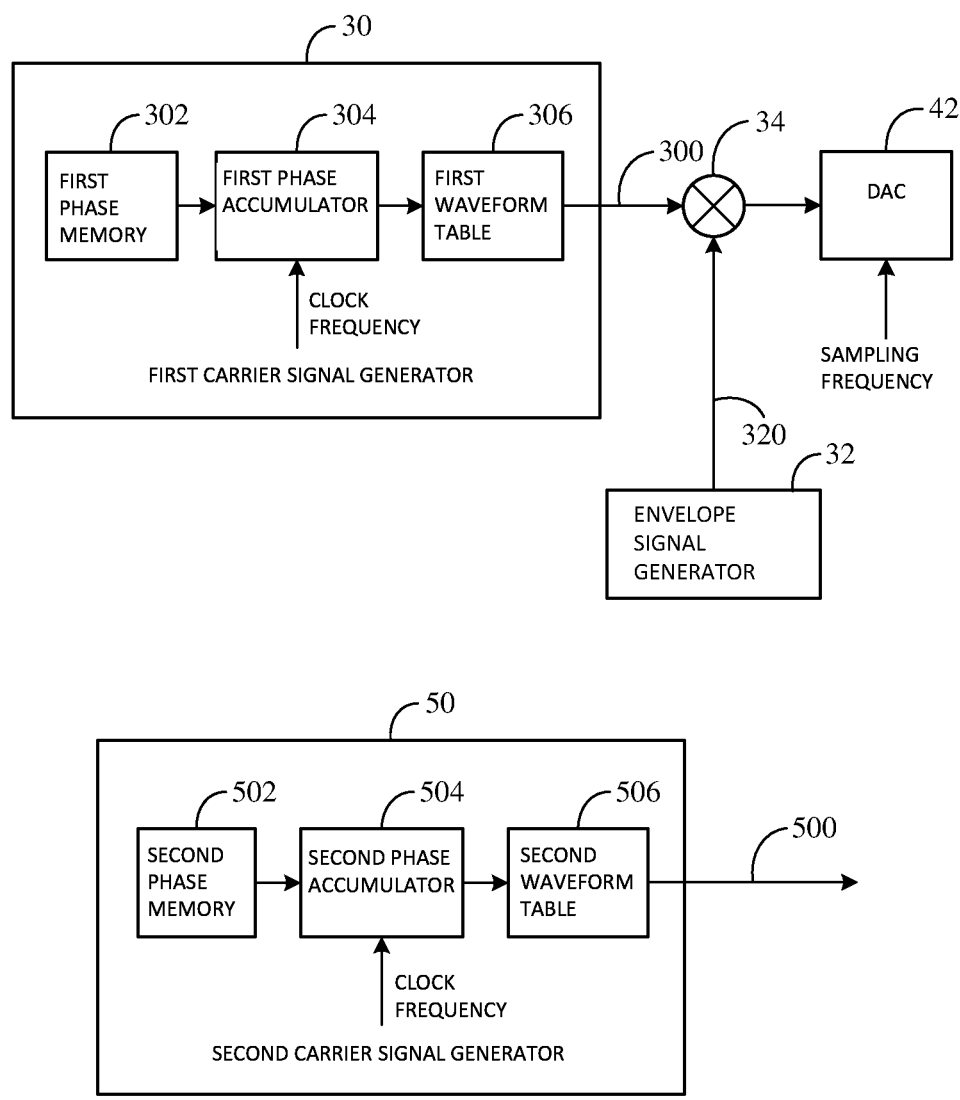
FIG. 4 is a functional module diagram of one embodiment of a first and second carrier signal generators as shown in FIG. 2.

Please also refer to FIG. 4, which is a functional module diagram of one embodiment of the first carrier signal generator 30 and the second carrier signal generator 50 as shown in FIG. 2. The first carrier signal generator 30 includes a first phase memory 302, a first phase accumulator 304, and a first waveform table 306. The first phase memory 302 is used for storing a first phase increment. The first phase accumulator 304 is used for setting an initial value of a first phase during initialization and for calculating a first accumulated phase by adding the first phase increment for every clock period. The first waveform table 306 is used for storing the first digital carrier signal and for outputting the first digital carrier signal corresponding to the first accumulated phase when the above first accumulated phase is input into the first waveform table 306.

Specifically, a phase of the first digital carrier signal generated by the first carrier signal generator 30 is adjusted by setting the initial value of the first phase.

The second carrier signal generator 50 includes a second phase memory 502, a second phase accumulator 504, and a second waveform table 506. The second phase memory 502 is used for storing a second phase increment. The second phase accumulator 504 is used for setting an initial value of a second phase during initialization and for calculating a second accumulated phase by adding the second phase increment for every clock period. The second waveform table 506 is used for storing the second digital carrier signal and for outputting the second digital carrier signal corresponding to the second accumulated phase when the second accumulated phase is input into the second waveform table 506. Specifically, the predetermined frequency shift between the second digital carrier signal and the first digital carrier signal is set by adjusting the second phase increment, and the predetermined phase shift between the second digital carrier signal and the first digital carrier signal is set by adjusting the initial value of the second phase.

Figure 5:
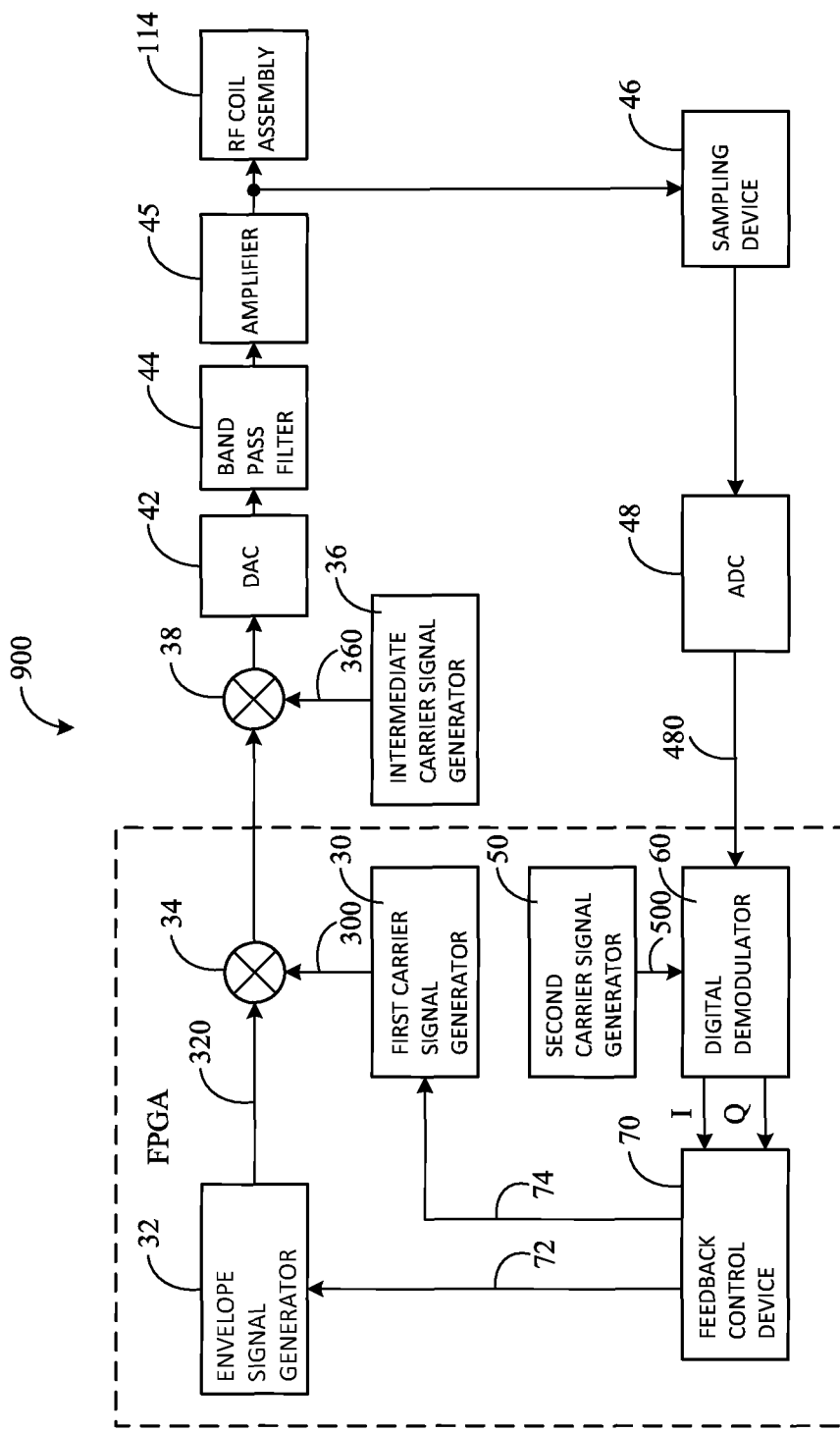
FIG. 5 is a functional module diagram of an RF amplification system according to a second embodiment.

Referring to FIG. 5, which is a functional module diagram of an RF amplification system 900 according to a second embodiment. A difference between the RF amplification system 900 of the second embodiment and the RF amplification system 800 of the first embodiment is that the RF amplification system 900 further includes an intermediate carrier signal generator 36 and a second digital modulator 38.

The intermediate carrier signal generator 36 is used for generating a third digital carrier signal 360.

The second digital modulator 38 is used for modulating the digital RF pulse signals having the first frequency generated by the first digital modulator 34 with the third digital carrier signal 360 to generate digital RF pulse signals having a second frequency that is greater than the first frequency. Thus, the DAC 42 converts the digital RF pulse signals having the second frequency into analog RF pulse signals, and the RF amplifier 45 is used for amplifying the analog RF pulse signals filtered by the filter 44 to generate an RF output signal. Finally, a frequency of the analog RF pulse signals generated by the DAC 42 in the RF amplification system 900 is greater than a frequency of the analog RF pulse signals generated by the DAC 42 in the RF amplification system 800.

The second frequency of the digital RF pulse signals is determined depending on the intensity of the static magnetic field. For example, in the apparatus with a static magnetic field intensity of 3.0 T (Tesla), the first frequency of the digital RF pulse signals is about 128.1 MHz. The sampling frequency fs of the DAC 42 must be greater than or equal to the Nyquist frequency. In FIG. 2, the sampling frequency fs is, for example, 480 MHz or 640 MHz.

In a non-limitative example, the frequency of the second digital carrier signal 500 is f3, the frequency of the first digital carrier signal 300 is f1, and a frequency of the third digital carrier signal 360 is f2, wherein f3=f1+f2. In other words, the frequency shift between the second digital carrier signal 500 and the first digital carrier signal 300 is f2.

In a non-limitative example, the phase shift between the second digital carrier signal 500 and the first digital carrier signal 300 is 0.

In one embodiment, the intermediate carrier signal generator 36 and the second digital modulator 38 are integrated into the DAC 42. Therefore, the RF amplification system 900 as described in the present invention may achieve advantageous technical effects of less electronic elements and simpler circuit design.

Although the present invention has been set forth in combination with specific embodiments, the person skilled in the art shall understand that many modifications and variations may be made to the present invention. Therefore, it should be recognized that the intention of the claims is to cover all these modifications and variations within the real concept and range of the present invention.

What is claimed is:

1. A radio frequency (RF) amplification system, comprising:
   a first digital modulator for modulating a first digital carrier signal with a digital envelop signal to generate digital RF pulse signals having a first frequency;
   a digital to analog converter (DAC) for converting the digital RF pulse signals into analog RF pulse signals;
   an RF amplifier for amplifying the analog RF pulse signals to generate an RF output signal;

an analog to digital converter (ADC) for converting an analog feedback signal sampled from the RF output signal into digital feedback signals;

a digital demodulator for performing quadrature demodulation on the digital feedback signals with a second digital carrier signal to generate an in-phase (I) signal and a quadrature (Q) signal; and a feedback control device configured to generate an amplitude setting signal for adjusting an amplitude of the digital envelop signal and a phase setting signal for adjusting a phase of the first digital carrier signal according to the I signal and the Q signal;

wherein the second digital carrier signal has a predetermined frequency shift relative to the first digital carrier signal, and the second digital carrier signal has a predetermined phase shift relative to the first digital carrier signal.

2. The RF amplification system of claim 1, further comprising:

an intermediate carrier signal generator for generating a third digital carrier signal; and a second digital modulator for modulating the digital RF pulse signals having the first frequency with the third digital carrier signal to generate digital RF pulse signals having a second frequency that is greater than the first frequency.

3. The RF amplification system of claim 2, wherein the intermediate carrier signal generator and the second digital modulator are integrated into the DAC.

4. The RF amplification system of claim 2, wherein the frequency of the second digital carrier signal is equal to f1+f2, wherein f1 is the frequency of the first digital carrier signal, f2 is the frequency of the third digital carrier signal.

5. The RF amplification system of claim 1, further comprising a first carrier signal generator for generating the first digital carrier signal, wherein the first carrier signal generator comprises:

a first phase memory for storing a first phase increment;

a first phase accumulator for setting an initial value of a first phase during initialization and for calculating a first accumulated phase by adding the first phase increment for every clock period; and a first waveform table for storing the first digital carrier signal and for outputting the first digital carrier signal corresponding to the first accumulated phase when the first accumulated phase is input into the first waveform table;

wherein the phase of the first carrier signal is adjusted by setting the initial value of the first phase.

6. The RF amplification system of claim 5, further comprising a second carrier signal generator for generating the second digital carrier signal, wherein the second carrier signal generator comprises:

a second phase memory for storing a second phase increment;

a second phase accumulator for setting an initial value of a second phase during initialization and for calculating a second accumulated phase by adding the second phase increment for every clock period; and a second waveform table for storing the second digital carrier signal and for outputting the second digital carrier signal corresponding to the second accumulated phase when the second accumulated phase is input into the second waveform table;

wherein the predetermined frequency shift is set by adjusting the second phase increment, the predetermined phase shift is set by adjusting the initial value of the second phase.

7. The RF amplification system of claim 1, wherein the feedback control device comprises:

an amplitude feedback loop for calculating an amplitude value based on the I signal and the Q signal, and generating the amplitude setting signal based on comparison between the amplitude value and an amplitude reference; and a phase feedback loop for generating the phase setting signal based on comparison between the I signal and the Q signal.

8. A method for amplifying a radio frequency (RF) signal, comprising:

modulating a first digital carrier signal with a digital envelop signal to generate digital RF pulse signals having a first frequency;

converting the digital RF pulse signals into analog RF pulse signals;

amplifying the analog RF pulse signals to generate an RF output signal;

converting an analog feedback signal sampled from the RF output signal into digital feedback signals;

demodulating the digital feedback signals with a second digital carrier signal to generate an in-phase (I) signal and a quadrature (Q) signal; and generating an amplitude setting signal for adjusting the amplitude of the digital envelop signal and a phase setting signal for adjusting the phase of the first digital carrier signal according to the I signal and the Q signal;

wherein the second digital carrier signal has a predetermined frequency shift relative to the first digital carrier signal, and the second digital carrier signal has a predetermined phase shift relative to the first digital carrier signal.

9. The method of claim 8, further comprising:

generating a third digital carrier signal by an intermediate carrier signal generator; and modulating the digital RF pulse signals having the first frequency with the third digital carrier signal to generate digital RF pulse signals having a second frequency;

wherein the second frequency is greater than the first frequency.

10. The method of claim 8, further comprising:

storing a first phase increment in a first phase memory;

setting an initial value of a first phase during initialization of a first phase accumulator and calculating a first accumulated phase by adding the first phase increment for every clock period; and storing the first digital carrier signal in a first waveform table and outputting from the first waveform table the first digital carrier signal corresponding to the first accumulated phase when the first accumulated phase is input into the first waveform table;

wherein the phase of the first digital carrier signal is adjusted by setting the initial value of the first phase.

11. The method of claim 10, further comprising storing a second phase increment in a second phase memory;

setting an initial value of a second phase during initialization of a second phase accumulator and calculating a second accumulated phase by adding the second phase increment for every clock period; and storing the second digital carrier signal in a second waveform table and outputting from the second waveform table the second digital carrier signal corresponding to the second accumulated phase when the second accumulated phase is input into the second waveform table;

wherein the predetermined frequency shift is set by adjusting the second phase increment, and the predetermined phase shift is set by adjusting the initial value of the second phase.

12. A magnetic resonance imaging (MRI) apparatus, comprising:

a radio frequency (RF) coil assembly; and an RF amplification system, comprising:

a first digital modulator for modulating a first digital carrier signal with a digital envelop signal to generate digital RF pulse signals having a first frequency;

a digital to analog converter (DAC) for converting the digital RF pulse signals into analog RF pulse signals;

an RF amplifier for amplifying the analog RF pulse signals to generate an RF output signal for exciting the RF coil assembly to transmit RF signals;

an analog to digital converter (ADC) for converting an analog feedback signal sampled from the RF output signal into digital feedback signals;

a digital demodulator for demodulating the digital feedback signals with a second digital carrier signal to generate an in-phase (I) signal and a quadrature (Q) signal; and a feedback control device configured to generate an amplitude setting signal for adjusting an amplitude of the digital envelop signal and a phase setting signal for adjusting a phase of the first digital carrier signal according to the I signal and the Q signal;

wherein the second digital carrier signal has a predetermined frequency shift relative to the first digital carrier signal, and the second digital carrier signal has a predetermined phase shift relative to the first digital carrier signal.

13. The MRI apparatus of claim 12, wherein the RF amplification system further comprises:

an intermediate carrier signal generator for generating a third digital carrier signal; and a second digital modulator for modulating the digital RF pulse signals having the first frequency with the third digital carrier signal to generate digital RF pulse signals having a second frequency;

wherein the second frequency is greater than the first frequency.

14. The MRI apparatus of claim 12, wherein the RF amplification system further comprises a first carrier signal generator for generating the first digital carrier signal, the first carrier signal generator comprises:

a first phase memory for storing a first phase increment;

a first phase accumulator for setting an initial value of a first phase during initialization and for calculating a first accumulated phase by adding the first phase increment for every clock period; and a first waveform table for storing the first digital carrier signal and for outputting the first digital carrier signal corresponding to the first accumulated phase when the first accumulated phase is input into the first waveform table;

wherein the phase of the first digital carrier signal is adjusted by setting the initial value of the first phase.

15. The MRI apparatus of claim 14, wherein the RF amplification system further comprises a second carrier signal generator for generating the second digital carrier signal, the second carrier signal generator comprises:

a second phase memory for storing a second phase increment;

a second phase accumulator for setting an initial value of a second phase during initialization and for calculating a second accumulated phase by adding the second phase increment for every clock period; and a second waveform table for storing the second digital carrier signal and for outputting the second digital carrier signal corresponding to the second accumulated phase when the second accumulated phase is input into the second waveform table;

wherein the predetermined frequency shift is set by adjusting the second phase increment, and the predetermined phase shift is set by adjusting the initial value of the second phase.

* * * * *